(12) United States Patent
Li

(10) Patent No.: US 11,756,497 B2
(45) Date of Patent: Sep. 12, 2023

(54) GOA CIRCUIT AND DISPLAY PANEL

(71) Applicant: SHENZHEN CHINA STAR OPTOELECTRONICS SEMICONDUCTOR DISPLAY TECHNOLOGY CO., LTD., Shenzhen (CN)

(72) Inventor: Yan Li, Shenzhen (CN)

(73) Assignee: SHENZHEN CHINA STAR OPTOELECTRONICS SEMICONDUCTOR DISPLAY TECHNOLOGY CO., LTD., Shenzhen (CN)

(*) Notice: Subject to any disclaimer, the term of this patent is extended or adjusted under 35 U.S.C. 154(b) by 332 days.

(21) Appl. No.: 17/056,717

(22) PCT Filed: Oct. 20, 2020

(86) PCT No.: PCT/CN2020/122024
§ 371 (c)(1),
(2) Date: Nov. 18, 2020

(87) PCT Pub. No.: WO2022/056992
PCT Pub. Date: Mar. 24, 2022

(65) Prior Publication Data
US 2022/0351697 A1    Nov. 3, 2022

(30) Foreign Application Priority Data
Sep. 17, 2020   (CN) .......................... 202010978416.6

(51) Int. Cl.
*G09G 3/36*    (2006.01)
*G09G 3/00*    (2006.01)
*G11C 19/28*   (2006.01)

(52) U.S. Cl.
CPC .......... *G09G 3/3677* (2013.01); *G09G 3/003* (2013.01); *G09G 2300/0408* (2013.01);
(Continued)

(58) Field of Classification Search
CPC ................. G09G 3/3677; G09G 3/003; G09G 2300/0408; G09G 2300/0426;
(Continued)

(56) References Cited

U.S. PATENT DOCUMENTS

| 10,484,577 B1 | 11/2019 | Zhang |
| 2010/0277206 A1* | 11/2010 | Lee ........................ G09G 3/3677 327/108 |

(Continued)

FOREIGN PATENT DOCUMENTS

| CN | 106104665 A | 11/2016 |
| CN | 106683631 A | 5/2017 |

(Continued)

OTHER PUBLICATIONS

International Search Report in International application No. PCT/CN2020/122024, dated May 26, 2021.
(Continued)

*Primary Examiner* — Adam J Snyder
(74) *Attorney, Agent, or Firm* — PV IP PC; Wei Te Chung; Zhigang Ma

(57) ABSTRACT

A gate driver on array (GOA) circuit and a display panel is provided. The GOA circuit includes a plurality of cascading GOA units. A current stage of the GOA units includes: a pull-up module, a pull-up control circuit unit, and a selection module. The pull-up module includes a first transistor. A source of the first transistor is connected to the selection module, a gate is connected to the pull-up control module through a first node, and a drain is configured to output a scan signal of the current stage. The selection module is (Continued)

configured to receive a first control signal and a second control signal to control the clock signal to transmit to the source of the first transistor.

15 Claims, 4 Drawing Sheets

(52) U.S. Cl.
CPC .............. *G09G 2300/0426* (2013.01); *G09G 2300/0819* (2013.01); *G09G 2310/0286* (2013.01); *G09G 2310/061* (2013.01); *G09G 2310/08* (2013.01); *G09G 2330/021* (2013.01); *G11C 19/28* (2013.01)

(58) Field of Classification Search
CPC ... G09G 2300/0819; G09G 2310/0286; G09G 2310/061; G09G 2310/08; G09G 2330/021; G11C 19/28
See application file for complete search history.

(56) References Cited

U.S. PATENT DOCUMENTS

| | | |
|---|---|---|
| 2013/0301793 A1 | 11/2013 | Tobita |
| 2017/0256217 A1 | 9/2017 | Xiao et al. |

FOREIGN PATENT DOCUMENTS

| | | | | |
|---|---|---|---|---|
| CN | 106875911 A | 6/2017 | | |
| CN | 107424554 A | 12/2017 | | |
| CN | 107564477 A | 1/2018 | | |
| CN | 108231029 A | 6/2018 | | |
| CN | 108648711 A | * 10/2018 | ......... | G06K 9/00006 |
| CN | 110021279 A | 7/2019 | | |
| CN | 110178174 A | 8/2019 | | |
| CN | 111312190 A | 6/2020 | | |
| WO | WO-2020177428 A1 | * 9/2020 | ............... | G09G 3/20 |

OTHER PUBLICATIONS

Written Opinion of the International Search Authority in International application No. PCT/CN2020/122024, dated May 26, 2021.
Chinese Office Action issued in corresponding Chinese Patent Application No. 202010978416.6 dated Apr. 25, 2021, pp. 1-9.

* cited by examiner

GOA CIRCUIT AND DISPLAY PANEL

RELATED APPLICATIONS

This application is a Notional Phase of PCT Patent Application No. PCT/CN2020/122024 having international filing date of Oct. 20, 2020, which claims the benefit of priority of Chinese Patent Application No. 202010978416.6 filed on Sep. 17, 2020. The contents of the above applications are all incorporated by reference as if fully set forth herein in their entirety.

FIELD

The present disclosure relates to display technologies, and more particularly, to a gate driver on array (GOA) circuit and a display panel.

BACKGROUND

A gate driver on array (GOA) technologies utilize a thin film transistor manufacturing process of an existing liquid crystal display array to fabricate a gate row scan driving circuit on an array substrate to realize a driving mode of gate lines progressive scan.

A GOA circuit in the prior art can only display with full screen, so even when only a part of the area or low-resolution images needs to be displayed in a standby state, a full-screen display is still required, which results in high power consumption. In addition, when the left and right eye images are displayed by the frequency doubling and time division technology to achieve 3D display effects, the full-screen display of the GOA circuit in the prior art can only display the left eye image and the right eye image at the same position. When a human brain is synthesizing the left and right eye images, discomforts such as dizziness and vomiting are prone to appear.

SUMMARY

In view of the above, the present disclosure provides a gate driver on array (GOA) circuit and a display panel to provide scan signals optionally to provide a partial-screen display function and to reduce power consumption. The disclosure can also apply on 3D display to display left eye images and right eye images at different pixels to achieve synthesizing the left and right eye images by a human brain and to improve effect of 3D display.

In order to achieve above-mentioned object of the present disclosure, one embodiment of the disclosure provides a GOA circuit, including a plurality of cascading GOA units, wherein a current stage of the GOA units includes: a pull-up module, a pull-up control module, a pull-down module, a pull-down maintaining module, and a selection module, and wherein the pull-up module includes:

a first transistor, wherein a source of the first transistor is connected to the selection module, a gate of the first transistor is connected to the pull-up control module through a first node, and a drain of the first transistor is configured to output a scan signal of the current stage; and an eleventh transistor, wherein a source of the eleventh transistor is configured to receive a clock signal, a gate of the eleventh transistor is connected to the first node, and a drain of the eleventh transistor is configured to output a starting signal of the current stage to a next stage of the GOA units, wherein the pull-up control module is configured to receive a starting signal of a previous stage of the GOA units and control the first transistor and the eleventh transistor to turn on or off by the first node; and wherein the selection module is configured to receive a first control signal and a second control signal to control the clock signal to transmit to the source of the first transistor.

In one embodiment of the GOA circuit, the pull-up control module includes a starting transistor, a source and a gate of the starting transistor are configured to receive the starting signal of the previous stage of the GOA units, and a drain of the starting transistor is connected to the first node.

In one embodiment of the GOA circuit, the selection module includes a first control transistor and a second control transistor, a source of the first control transistor is configured to receive the clock signal, a gate of the first control transistor is configured to receive the first control signal, a drain of the first control transistor is connected to a source of the second control transistor, a gate of the second transistor is configured to receive the second control signal, a drain of the second control transistor is connected to a reference low level, the first transistor is configured to receive the clock signal through the first control transistor, and the first transistor is connected to the reference low level through the second control transistor.

In one embodiment of the GOA circuit, a phase of the second control signal and a phase of the first control signal are totally in opposite phase.

In one embodiment of the GOA circuit, the pull-down module includes:

a second transistor, wherein a source of the second transistor is connected to the drain of the first transistor, a gate of the second transistor is configured to receive a starting signal of a next stage of the GOA units, and a drain of the second transistor is connected to a second low level; and a twelfth transistor, wherein a source of the twelfth transistor is connected to the first node, a gate of the twelfth transistor is configured to receive the starting signal of the next stage of the GOA units, and a drain of the twelfth transistor is connected to the first low level.

In one embodiment of the GOA circuit, the pull-down maintaining module includes:

a third transistor, wherein a gate of the third transistor is connected to a second node, a source of the third transistor is connected to the first node, and a drain of the third transistor is connected to the first low level;

a fourth transistor, wherein a source of the fourth transistor is configured to receive the scan signal of the current stage, a gate of the fourth transistor is connected to the second node, and a drain of the fourth transistor is connected to the second low level;

a fifth transistor, wherein a source of the fifth transistor is configured to receive the starting signal of the current stage, a gate of the fifth transistor is connected to the second node, and a drain of the fifth transistor is connected to the first low level;

a sixth transistor, wherein a source and a gate of the sixth are configured to receive a first switch signal;

a seventh transistor, wherein a source of the seventh transistor is connected to a drain of the sixth transistor, a gate of the seventh transistor is connected to the first node, and a drain of the seventh transistor is connected to the first low level;

an eighth transistor, wherein a source of the eighth transistor is configured to receive the first switch signal, a gate of the eighth transistor is connected to the drain of the sixth transistor; and a ninth transistor, wherein a source of the ninth transistor is connected to a drain of the eighth transistor, a gate of the ninth transistor is connected to the first node, and a drain of the ninth transistor is connected to the first low level.

In one embodiment of the GOA circuit, the pull-down maintaining module includes:

a thirteenth transistor, wherein a source of the thirteenth transistor is configured to receive the scan signal of the current stage, a gate of the thirteenth transistor is connected to a third node, and a drain of the thirteenth transistor is connected to the second low level;

a fourteenth transistor, wherein a source of the fourteenth transistor is connected to the first node, a gate of the fourteenth transistor is connected to the third node, and a drain of the fourteenth transistor is connected to the first low level;

a fifteenth transistor, wherein a source of the fifteenth transistor is configured to receive the starting signal of the current stage, a gate of the fifteenth transistor is connected to the third node, and a drain of the fifteenth transistor is connected to the first low level;

a sixteenth transistor, wherein a source and a gate of the sixteenth transistor are configured to receive a second switch signal;

a seventeenth transistor, wherein a source of the seventeenth transistor is connected to a drain of the sixteenth transistor, a gate of the seventeenth transistor is connected to the first node, and a drain of the seventeenth transistor is connected to the first low level;

an eighteenth transistor, wherein a source of the eighteenth transistor is configured to receive the second switch signal, and a gate of the eighteenth transistor is connected to the drain of the sixteenth transistor; and a nineteenth transistor, wherein a source of the nineteenth transistor is connected to a drain of the eighteenth transistor, a gate of the nineteenth transistor is connected to the first node, and a drain of the nineteenth transistor is connected to the first low level.

Another embodiment of the disclosure provides a display panel, including a GOA circuit, an array substrate, and a selection circuit, wherein the GOA circuit includes a plurality of cascading GOA units, wherein a current stage of the GOA units includes: a pull-up module, a pull-up control module, a pull-down module, a pull-down maintaining module, and a selection module, and wherein the pull-up module includes:

a first transistor, wherein a source of the first transistor is connected to the selection module, a gate of the first transistor is connected to the pull-up control module through a first node, and a drain of the first transistor is configured to output a scan signal of the current stage; and an eleventh transistor, wherein a source of the eleventh transistor is configured to receive a clock signal, a gate of the eleventh transistor is connected to the first node, and a drain of the eleventh transistor is configured to output a starting signal of the current stage to a next stage of the GOA units, wherein the pull-up control module is configured to receive a starting signal of a previous stage of the GOA units and control the first transistor and the eleventh transistor to turn on or off by the first node;

wherein the selection module is configured to receive a first control signal and a second control signal to control the clock signal to transmit to the source of the first transistor;

wherein the selection circuit includes a first enabling line and a second enabling line, and the first enabling line is configured to provide the first control signal to a portion of the GOA units; and wherein the second enabling line is configured to provide the first control signal to another portion of the GOA units.

In one embodiment of the display panel, each of the GOA units includes an inverter gate to reverse the first control signal to provide the second control signal correspondingly.

In one embodiment of the display panel, odd stages of the GOA units are connected to the first enabling line, and even stages of the GOA units are connected to the second enabling line.

In one embodiment of the display panel, the pull-up control module includes a starting transistor, a source and a gate of the starting transistor are configured to receive the starting signal of the previous stage of the GOA units, and a drain of the starting transistor is connected to the first node.

In one embodiment of the display panel, the selection module includes a first control transistor and a second control transistor, a source of the first control transistor is configured to receive the clock signal, a gate of the first control transistor is configured to receive the first control signal, a drain of the first control transistor is connected to a source of the second control transistor, a gate of the second control transistor is configured to receive the second control signal, a drain of the second control transistor is connected to a reference low level, the first transistor is configured to receive the clock signal through the first control transistor, and the first transistor is connected to the reference low level through the second control transistor.

In one embodiment of the display panel, a phase of the second control signal and a phase of the first control signal are totally in opposite phase.

In one embodiment of the display panel, the pull-down module includes:

a second transistor, wherein a source of the second transistor is connected to the drain of the first transistor, a gate of the second transistor is configured to receive a starting signal of a next stage of the GOA units, and a drain of the second transistor is connected to a second low level; and a twelfth transistor, wherein a source of the twelfth transistor is connected to the first node, a gate of the twelfth transistor is configured to receive the starting signal of the next stage of the GOA units, and a drain of the twelfth transistor is connected to the first low level.

In one embodiment of the display panel, the pull-down maintaining module includes:

a third transistor, wherein a gate of the third transistor is connected to a second node, a source of the third transistor is connected to the first node, and a drain of the third transistor is connected to the first low level;

a fourth transistor, wherein a source of the fourth transistor is configured to receive the scan signal of the current stage, a gate of the fourth transistor is connected to the second node, and a drain of the fourth transistor is connected to the second low level;

a fifth transistor, wherein a source of the fifth transistor is configured to receive the starting signal of the current stage, a gate of the fifth transistor is connected to the second node, and a drain of the fifth transistor is connected to the first low level;

a sixth transistor, wherein a source and a gate of the sixth are configured to receive a first switch signal;

a seventh transistor, wherein a source of the seventh transistor is connected to a drain of the sixth transistor, a gate of the seventh transistor is connected to the first node, and a drain of the seventh transistor is connected to the first low level;

an eighth transistor, wherein a source of the eighth transistor is configured to receive the first switch signal, a gate of the eighth transistor is connected to the drain of the sixth transistor; and a ninth transistor, wherein a source of the ninth transistor is connected to a drain of the eighth transistor, a gate of the ninth transistor is connected to the first node, and a drain of the ninth transistor is connected to the first low level.

In one embodiment of the display panel, the pull-down maintaining module includes:

a thirteenth transistor, wherein a source of the thirteenth transistor is configured to receive the scan signal of the current stage, a gate of the thirteenth transistor is connected to a third node, and a drain of the thirteenth transistor is connected to the second low level;

a fourteenth transistor, wherein a source of the fourteenth transistor is connected to the first node, a gate of the fourteenth transistor is connected to the third node, and a drain of the fourteenth transistor is connected to the first low level;

a fifteenth transistor, wherein a source of the fifteenth transistor is configured to receive the starting signal of the current stage, a gate of the fifteenth transistor is connected to the third node, and a drain of the fifteenth transistor is connected to the first low level;

a sixteenth transistor, wherein a source and a gate of the sixteenth transistor are configured to receive a second switch signal;

a seventeenth transistor, wherein a source of the seventeenth transistor is connected to a drain of the sixteenth transistor, a gate of the seventeenth transistor is connected to the first node, and a drain of the seventeenth transistor is connected to the first low level;

an eighteenth transistor, wherein a source of the eighteenth transistor is configured to receive the second switch signal, and a gate of the eighteenth transistor is connected to the drain of the sixteenth transistor; and a nineteenth transistor, wherein a source of the nineteenth transistor is connected to a drain of the eighteenth transistor, a gate of the nineteenth transistor is connected to the first node, and a drain of the nineteenth transistor is connected to the first low level.

Further, another embodiment of the disclosure provides a display panel, including a GOA circuit, an array substrate, and a selection circuit, wherein the GOA circuit includes a plurality of cascading GOA units, wherein a current stage of the GOA units includes: a pull-up module, a pull-up control module, a pull-down module, a pull-down maintaining module, and a selection module, and wherein the pull-up module includes:

a first transistor, wherein a source of the first transistor is connected to the selection module, a gate of the first transistor is connected to the pull-up control module through a first node, and a drain of the first transistor is configured to output a scan signal of the current stage; and an eleventh transistor, wherein a source of the eleventh transistor is configured to receive a clock signal, a gate of the eleventh transistor is connected to the first node, and a drain of the eleventh transistor is configured to output a starting signal of the current stage to a next stage of the GOA units, wherein the pull-up control module includes a starting transistor, a source and a gate of the starting transistor are configured to receive a starting signal of a previous stage of the GOA units, and a drain of the starting transistor is connected to the first node;

wherein the pull-up control module is configured to receive the starting signal of the previous stage of the GOA units and control the first transistor and the eleventh transistor to turn on or off by the first node;

wherein the selection module is configured to receive a first control signal and a second control signal to control the clock signal to transmit to the source of the first transistor;

wherein the selection circuit includes a first enabling line and a second enabling line, and the first enabling line is configured to provide the first control signal to a portion of the GOA units; and wherein the second enabling line is configured to provide the first control signal to another portion of the GOA units.

In one embodiment of the display panel, the selection module includes a first control transistor and a second control transistor, a source of the first control transistor is configured to receive the clock signal, a gate of the first control transistor is configured to receive the first control signal, a drain of the first control transistor is connected to a source of the second control transistor, a gate of the second transistor is configured to receive the second control signal, a drain of the second control transistor is connected to a reference low level, the first transistor is configured to receive the clock signal through the first control transistor, and the first transistor is connected to the reference low level through the second control transistor.

In comparison with prior art, the GOA circuit and the display panel of the disclosure provides the selection module to output the scan signal Gn optionally without affecting a stage transmitting function of the GOA units. It can control the output of the scan signal Gn by electrical levels of the first control signal and the second control signal.

BRIEF DESCRIPTION OF DRAWINGS

In the following, in conjunction with accompanying drawings, through a detailed description of the detail implementations of the present application, the technical solutions and other beneficial effects of the present application will be clearly.

DETAILED DESCRIPTION

Figure 1:
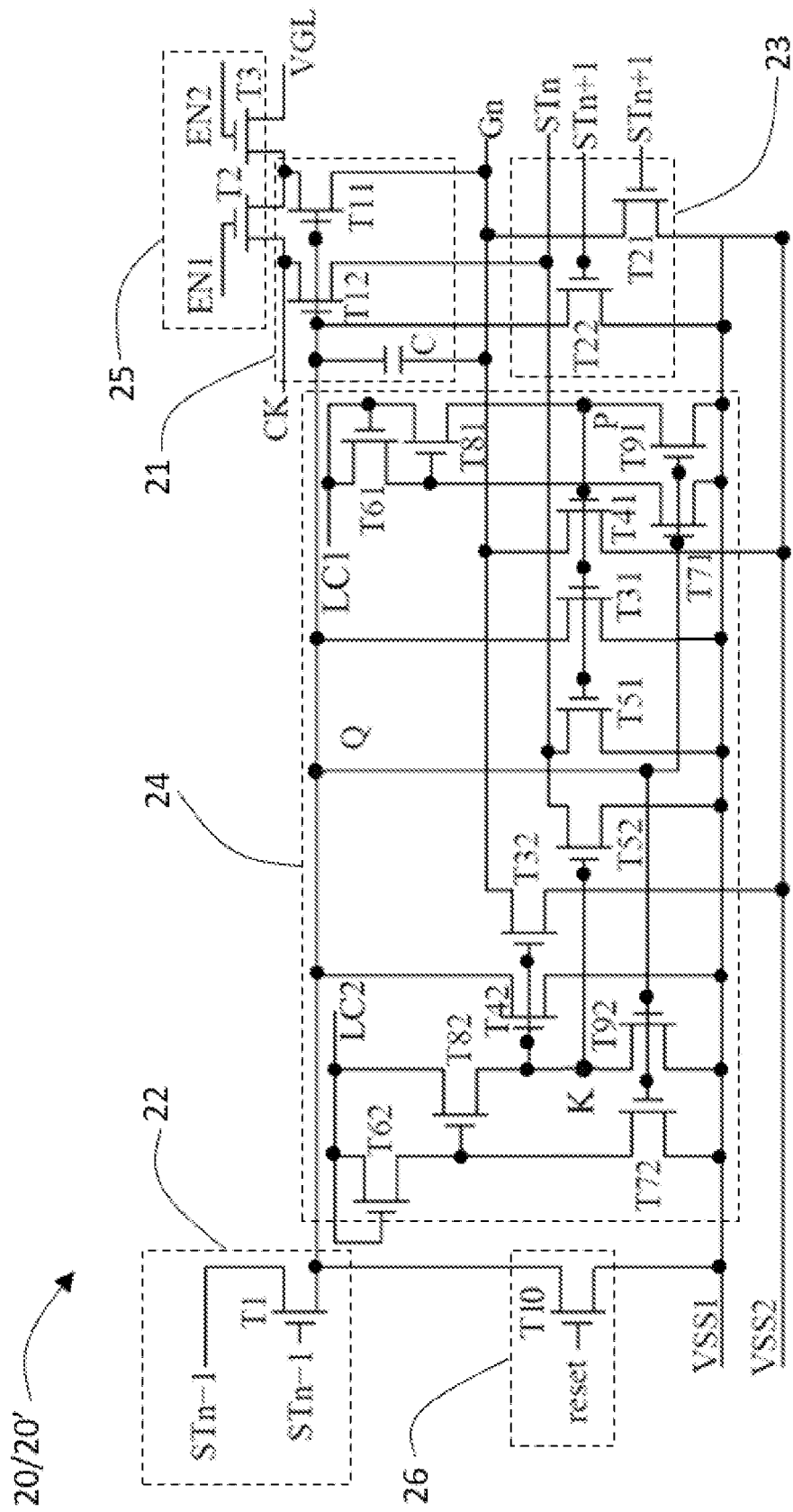
FIG. 1 is a schematic view of a gate driver on array (GOA) circuit according to an embodiment of the present disclosure.

The specific structure and functional details disclosed herein are only representative and are used for the purpose of describing exemplary embodiments of the present application. However, this application can be implemented in many alternative forms, and should not be interpreted as being limited to the embodiments set forth herein.

In the description of this application, it should be understood that the terms "center", "lateral", "upper", "lower", "left", "right", "vertical", "horizontal", "top", The orientation or positional relationship indicated by "bottom", "inner", and "outer" is based on the orientation or positional relationship shown in the drawings, and is only for the convenience of describing the application and simplifying the description, and does not indicate or imply the device referred to Or the element must have a specific orientation, be constructed and operated in a specific orientation, and therefore cannot be understood as a limitation of the present application. In addition, the terms "first" and "second" are only used for descriptive purposes and cannot be understood as indicating or implying relative importance or implicitly indicating the number of indicated technical features. Thus, the features defined with "first" and "second" may explicitly or implicitly include one or more of these features. In the description of this application, unless otherwise specified, "plurality" means two or more. In addition, the term "including" and any variations thereof is intended to cover non-exclusive inclusion.

In the description of this application, it should be noted that the terms "installation", "connection", and "connection" should be understood in a broad sense unless otherwise clearly specified and limited. For example, it can be a support connection or a detachable connection. Connected or integrally connected; it can be a mechanical connection or an electrical connection; it can be directly connected or indirectly connected through an intermediate medium, and it can be the internal communication between two components. For those of ordinary skill in the art, the specific meanings of the above-mentioned terms in this application can be understood under specific circumstances.

The terms used herein are only for describing specific embodiments and are not intended to limit the exemplary embodiments. Unless the context clearly dictates otherwise, the singular forms "a" and "one" used herein are also intended to include the plural. It should also be understood that the terms "including" and/or "comprising" used herein specify the existence of the stated features, integers, steps, operations, units and/or components, and do not exclude the existence or addition of one or more Other features, integers, steps, operations, units, components, and/or combinations thereof.

The application will be further described below in conjunction with the drawings and embodiments.

Figure 2:
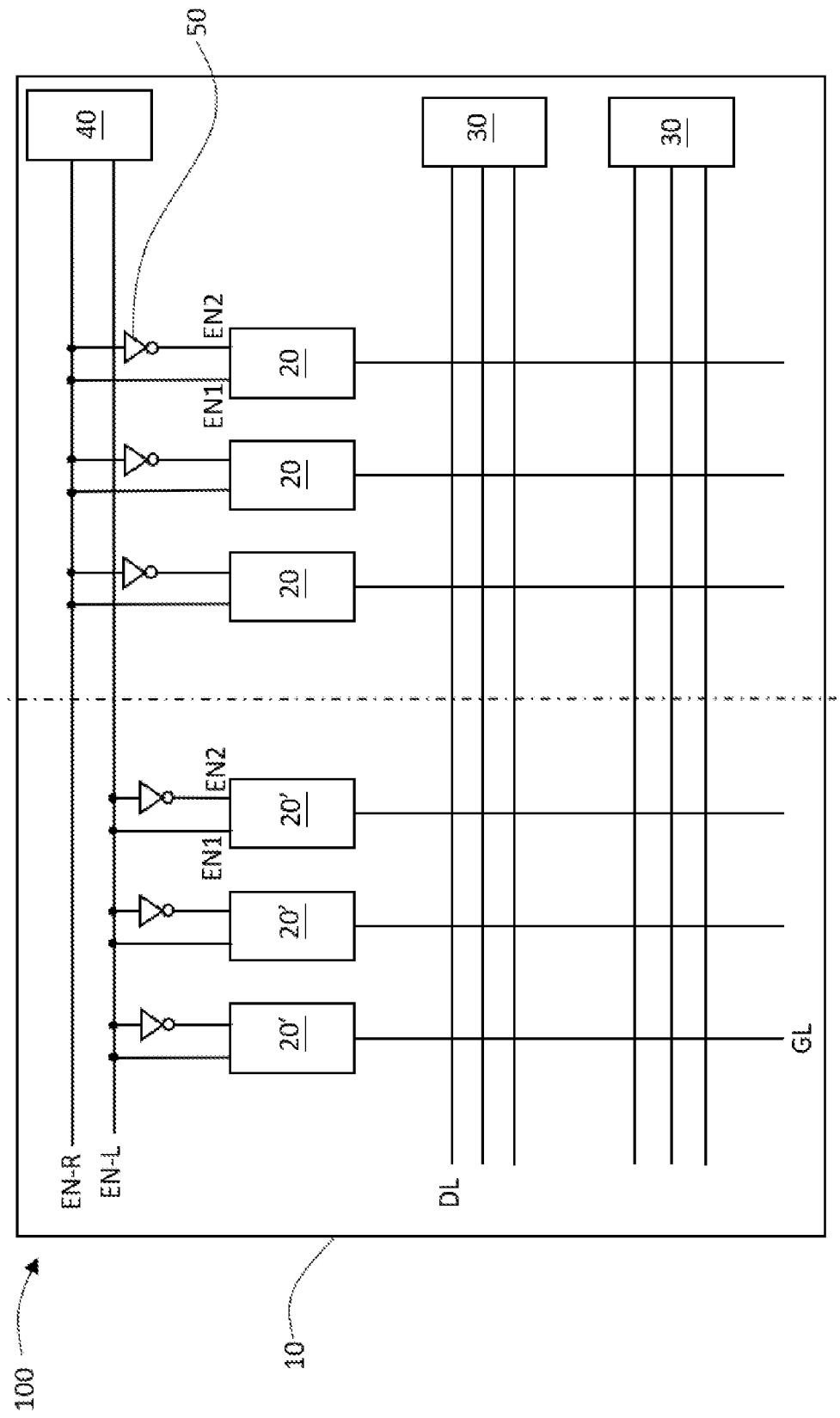
FIG. 2 is a schematic view of a display panel according to an embodiment of the present disclosure.

Referring to FIG. 1 and FIG. 2, one embodiment of the disclosure provides a GOA circuit, including a plurality of cascading GOA units 20, 20', wherein a current stage of the GOA units 20, 20' includes: a pull-up module 21, a pull-up control module 22, a pull-down module 23, a pull-down maintaining module 24, and a selection module 25. The pull-up module 21 includes a first transistor T11 and an eleventh transistor T12. A source of the first transistor T11 is connected to the selection module 25, a gate of the first transistor T11 is connected to the pull-up control module 22 through a first node Q, and a drain of the first transistor T11 is configured to output a scan signal Gn of the current stage. A source of the eleventh transistor T12 is configured to receive a clock signal CK, a gate of the eleventh transistor T12 is connected to the first node Q, and a drain of the eleventh transistor T12 is configured to output a starting signal STn of the current stage to a next stage of the GOA units. The pull-up control module 22 is configured to receive a starting signal STn−1 of a previous stage of the GOA units and control the first transistor T11 and the eleventh transistor T12 to turn on or off by the first node Q. The selection module 25 is configured to receive a first control signal EN1 and a second control signal EN2 to control the clock signal CK to transmit to the source of the first transistor T11.

In one embodiment of the GOA circuit, the pull-up control module 22 includes a starting transistor T1, a source and a gate of the starting transistor T1 are configured to receive the starting signal STn−1 of the previous stage of the GOA units, and a drain of the starting transistor T1 is connected to the first node Q. In one embodiment of the GOA circuit, the selection module 25 includes a first control transistor T2 and a second control transistor T3. A source of the first control transistor T2 is configured to receive the clock signal CK, a gate of the first control transistor T2 is configured to receive the first control signal EN1, a drain of the first control transistor T2 is connected to a source of the second control transistor T3, a gate of the second transistor T3 is configured to receive the second control signal EN2, a drain of the second control transistor T3 is connected to a reference low level VGL. The first transistor T11 is configured to receive the clock signal CK through the first control transistor T2, and the first transistor T11 is connected to the reference low level VGL through the second control transistor T3.

Figure 4:
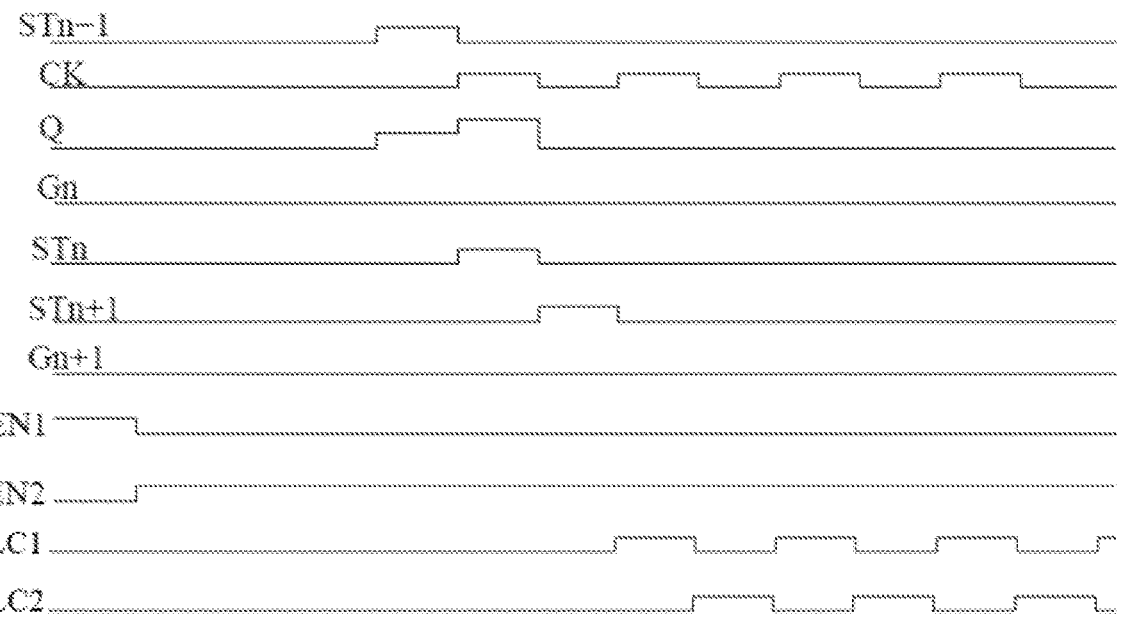
FIG. 4 is a schematic view of a signal time sequence when a GOA circuit provides a low level scan signal according to a second embodiment of the present disclosure.
Figure 5:
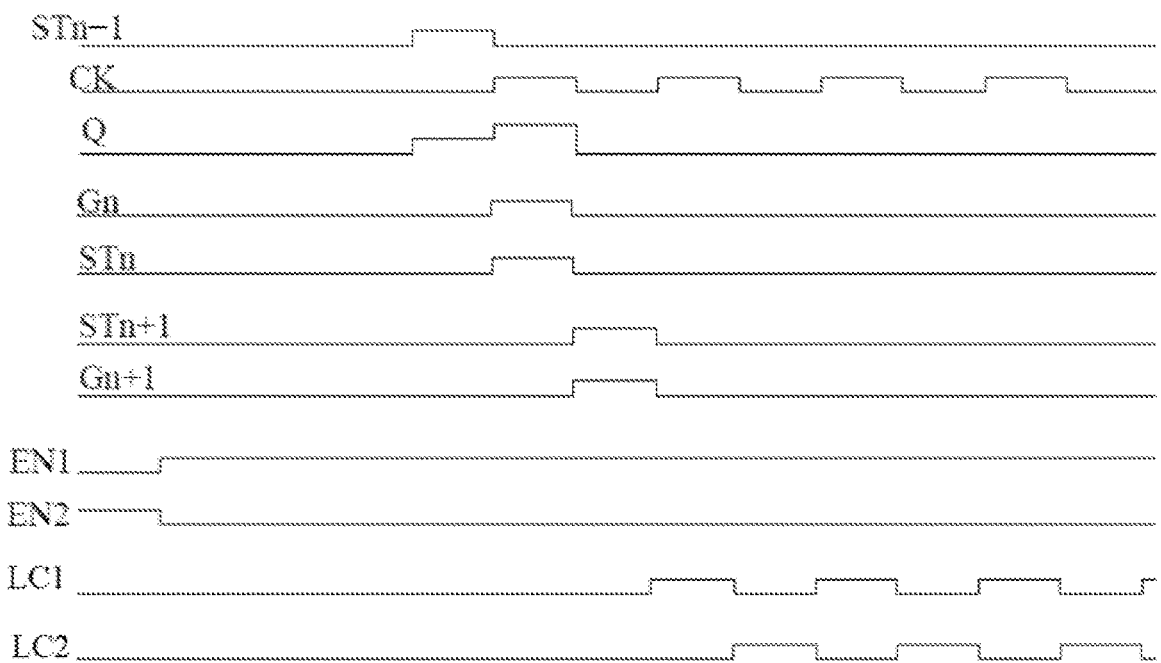
FIG. 5 is a schematic view of a signal time sequence when a GOA circuit provides a high level scan signal according to a second embodiment of the present disclosure.

Referring to FIG. 4 and FIG. 5, in one embodiment of the GOA circuit, a phase of the second control signal EN2 and a phase of the first control signal EN1 are totally in opposite phase.

Referring to FIG. 1 and FIG. 2, in one embodiment of the GOA circuit, the pull-down module 23 includes a second transistor T21 and a twelfth transistor T22. A source of the second transistor T21 is connected to the drain of the first transistor T11, a gate of the second transistor T21 is configured to receive a starting signal STn+1 of a next stage of the GOA units, and a drain of the second transistor T21 is connected to a second low level VSS2. A source of the twelfth transistor T22 is connected to the first node Q, a gate of the twelfth transistor T22 is configured to receive the starting signal STn+1 of the next stage of the GOA units, and a drain of the twelfth transistor T22 is connected to the first low level VSS1.

In one embodiment of the GOA circuit, the pull-down maintaining module 24 includes a third transistor T31, a fourth transistor T41, a fifth transistor T51, a sixth transistor T61, a seventh transistor T71, an eighth transistor T81, and a ninth transistor T91. Gates of the third transistor T31, the fourth transistor T41, the fifth transistor T51 are connected to a second node P. A source of the third transistor T31 is connected to the first node Q, and a drain of the third transistor T31 is connected to the first low level VSS1. A source of the fourth transistor T41 is configured to receive the scan signal Gn of the current stage, and a drain of the fourth transistor T41 is connected to the second low level VSS2. A source of the fifth transistor T51 is configured to receive the starting signal STn of the current stage, and a drain of the fifth transistor T51 is connected to the first low level VSS1.

A source and a gate of the sixth T61 are configured to receive a first switch signal LC1. A gate of the seventh transistor T71 is connected to the first node Q, a source of the seventh transistor T71 is connected to a drain of the sixth transistor T61, and a drain of the seventh transistor T71 is connected to the first low level VSS1. A gate of the eighth transistor T81 is connected to the drain of the sixth transistor T61, that is, the gate of the eighth transistor T81 is connected to the source of the seventh transistor T71, a source of the eighth transistor T81 is connected to the gate of the sixth transistor T61, that is, the source of the eighth transistor T81 is configured to receive the first switch signal LC1, and a drain of the eighth transistor T81 is connected to the second node P. A source of the ninth transistor T91 is connected to the second node P, that is the source of the ninth transistor T91 is connected to the drain of the eighth transistor T81, a gate of the ninth transistor T91 is connected to the first node Q, and a drain of the ninth transistor T91 is connected to the first low level VSS1.

The current stage of the GOA units further includes a reset module 26. The reset module 26 includes a tenth transistor T10. A source of the tenth transistor T10 is connected to the drain of the starting transistor T1, a gate of the tenth transistor T10 is configured to receive a reset signal reset, and a drain of the tenth transistor T10 is connected to the first low level VSS1. The reset module 26 is configured to receive the reset signal reset to pull down the level of the first node Q to a low level to reset the current stage of the GOA units.

In one embodiment of the GOA circuit, the pull-down maintaining module 24 includes a thirteenth transistor T32, a fourteenth transistor T42, a fifteenth transistor T52, a sixteenth transistor T62, a seventeenth transistor T72, an eighteenth transistor T82, and a nineteenth transistor T92. Gates of the thirteenth transistor T32, the fourteenth transistor T42, and the fifteenth transistor T52 are connected to a third node K, a source of the thirteenth transistor T32 is configured to receive the scan signal Gn of the current stage, and a drain of the thirteenth transistor T32 is connected to the second low level VSS2. A source of the fourteenth transistor T412 is connected to the first node Q, and a drain of the fourteenth transistor T42 is connected to the first low level VSS1. A source of the fifteenth transistor T52 is configured to receive the starting signal STn of the current stage, and a drain of the fifteenth transistor T52 is connected to the first low level VSS1.

A source and a gate of the sixteenth transistor T62 are configured to receive a second switch signal LC2. A gate of the seventeenth transistor T72 is connected to the first node Q, a source of the seventeenth transistor T72 is connected to a drain of the sixteenth transistor T62, and a drain of the seventeenth transistor T72 is connected to the first low level VSS1. A gate of the eighteenth transistor T82 is connected to the drain of the sixteenth transistor T62, that is, the gate of the eighteenth transistor T82 is connected to the source of the seventeenth transistor T72, and a source of the eighteenth transistor T82 is connected to the gate of the sixteenth transistor T62, that is, the source of the eighteenth transistor T82 is configured to receive the second switch signal LC2. A drain of the eighteenth transistor T82 is connected to the third node K. A source of the nineteenth transistor T92 is connected to the third node K, that is the source of the nineteenth transistor T92 is connected to the drain of the eighteenth transistor T82, a gate of the nineteenth transistor T92 is connected to the first node Q, and a drain of the nineteenth transistor T92 is connected to the first low level VSS1.

Referring to FIG. 4 and FIG. 5, the starting transistor T1 of the pull-up control module 22 of the current stage of the GOA units is conductive when the starting signal STn-1 of the previous stage of the GOA units is at a high level and the clock signal CK is at a low level. The first node Q is pulled up to a first high level to turn on the first transistor T1 and the eleventh transistor T12. The scan signa Gn and the starting signal STn of the current stage are still at a low level because the clock signal CK is at a low level. Meanwhile, the pull-down maintaining module 24 stops to work. The seventh transistor T71, the nineth transistor T91, the seventeenth transistor T72, and the nineteenth transistor T92 are turned on by a high level of the Q node. Potential of the second node P and the third node K are pulled down to turn off the third transistor T31, the fourth transistor T41, the fifth transistor T51, the thirteenth transistor T32, the fourteenth transistor T42, and the fifteenth transistor T52 to avoid the third transistor T31, the fourth transistor T41, the fifth transistor T51, the thirteenth transistor T32, the fourteenth transistor T42, and the fifteenth transistor T52 from pulling down the first node Q, the scan signal Gn of the current stage, and the starting signal STn of the current stage.

Referring to FIG. 5, in a next clock, the starting signal STn-1 of the previous stage is at a low level, and the clock signal CK is at a high level. The starting transistor T1 of the pull-up control module 22 is turned off. The first node Q is at a floating state. The bootstrap capacitor C provides a coupling effect when the clock signal CK transferring from a low level to a high level to bootstrap a level of the first node Q to a second high level. The first transistor T11 and the eleventh transistor T12 are totally turned on. The scan signal Gn and the starting signal STn of the current stage provide a high level.

Go to a next clock, the starting signal STn-1 of the previous stage is still at a low level. The clock signal CK transfers to a low level. The starting signal STn+1 of the next stage of the GOA units transfers to a high level. The second transistor T21 and the twelfth transistor T22 of the pull-down module 23 are turned on to pull down the scan signa Gn of the current stage and the first node Q. Because the first node Q is pulled down to a low level, the seventh transistor T71, the nineth transistor T91, the seventeenth transistor T72, and the nineteenth transistor T92 of the pull-down maintaining module 24 are turned off. The second node P and the third node K are no longer to pull down to a low level for the starting of the pull-down maintaining module 24 at a next clock.

Further, go to a next clock, the first switch signal LC1 or the second switch signal LC2 is at a high level. A phase of the first switch signal LC1 and a phase of the second switch signal LC2 are in opposite phase for alternating a right side and a left side of the pull-down maintaining module 24 to work. When the first switch signal LC1 is at a high level, the second switch signal LC2 is at a low level. The sixth transistor T61 and the eighth transistor T81 at the right side of the pull-down maintaining module 24 are turned on to pull up the second node P to a high level. The third transistor T31, the fourth transistor T41, and the fifth transistor T51 are turned on to maintain a low level of the first node Q, the scan signal Gn of the current stage, and the starting signal STn of the current stage. That is, circuits at the right side of the pull-down maintaining module 24 work to maintain a low level of a signal of the current stage. In a similar way, when the second switch signal LC2 is at a high level, the first switch signal LC1 is at a low level. The sixteenth transistor T62 and the eighteenth transistor T82 at the left side of the pull-down maintaining module 24 are turned on to pull up the third node K to a high level. The thirteenth transistor T32, the fourteenth transistor T42, and the fifteenth transistor T52 are turned on to maintain a low level of the first node Q, the scan signal Gn of the current stage, and the starting signal STn of the current stage. The phase of the first switch signal LC1 and the phase of the second switch signal LC2 are in opposite phase for alternating transistors at the right side and at the left side of the pull-down maintaining module 24 to work to avoid from threshold voltage drift of the transistors under a long term stress.

Referring to FIG. 1, FIG. 4, and FIG. 5, the disclosure provides a first control signal EN1 and a second control signal EN2 to control the gate of the first control transistor T2 and the gate of the second control transistor T3. When the scan signal Gn of the current stage needs to provide a high level scan signal, the first control signal EN1 is at a high level, and the second control signal EN2 is at a low level to let the clock signal CK pass through the first transistor T11 to make the scan signal Gn of the current stage output a high level, as shown in FIG. 5. When the scan signal Gn of the current stage needs to provide a low level scan signal, the first control signal EN1 is at a low level, and the second control signal EN2 is at a high level to let the clock signal CK always been pulled down to make the first transistor T11 provide a low level scan signal Gn of the current stage, as shown in FIG. 4.

Referring to FIG. 2, Another embodiment of the disclosure provides a display panel 100, including anyone of the abovementioned GOA circuits, an array substrate 10, and a selection circuit 40. The selection circuit 40 includes a first enabling line EN-R and a second enabling line EN-L, and the first enabling line EN-R is configured to provide the first control signal EN1 to a portion of the GOA units 20. The second enabling line EN-L is configured to provide the first control signal EN1 to another portion of the GOA units 20'.

In detail, the GOA circuit is disposed on the array substrate 10. The display panel 100 further includes a plurality of source driving circuits 30, a plurality of gate lines GL, and a plurality of data lines DL disposed on the array substrate 10. Each cross-section of the gate lines GL and the data lines DL provides a pixel circuit (not shown). The GOA units 20, 20' are corresponding to the gate lines GL for providing scan signals.

In detail, the selection circuit 40 control a right side of the display panel 100 to display and a left side of the display panel 100 not to display or reversed through the first enabling line EN-R and the second enabling line EN-L. The display panel 100 is suitable for some 3D display to show left eye images and right eye images respectively.

In detail, referring to FIG. 1 and FIG. 2, a stage transmitting function of the GOA units 20, 20' is based on the starting signals, such as the starting signal STn−1 of the previous stage, the starting signal STn of the current stage, and the starting signal STn+1 of the next stages. Even the selection circuit 40 pull down some scan signals of the GOA units 20, 20', the stage transmitting function of the GOA units 20, 20' will not be affected.

In one embodiment of the display panel, each of the GOA units 20, 20' includes an inverter gate 50 to reverse the first control signal EN1 to provide the second control signal EN2 correspondingly.

Figure 3:
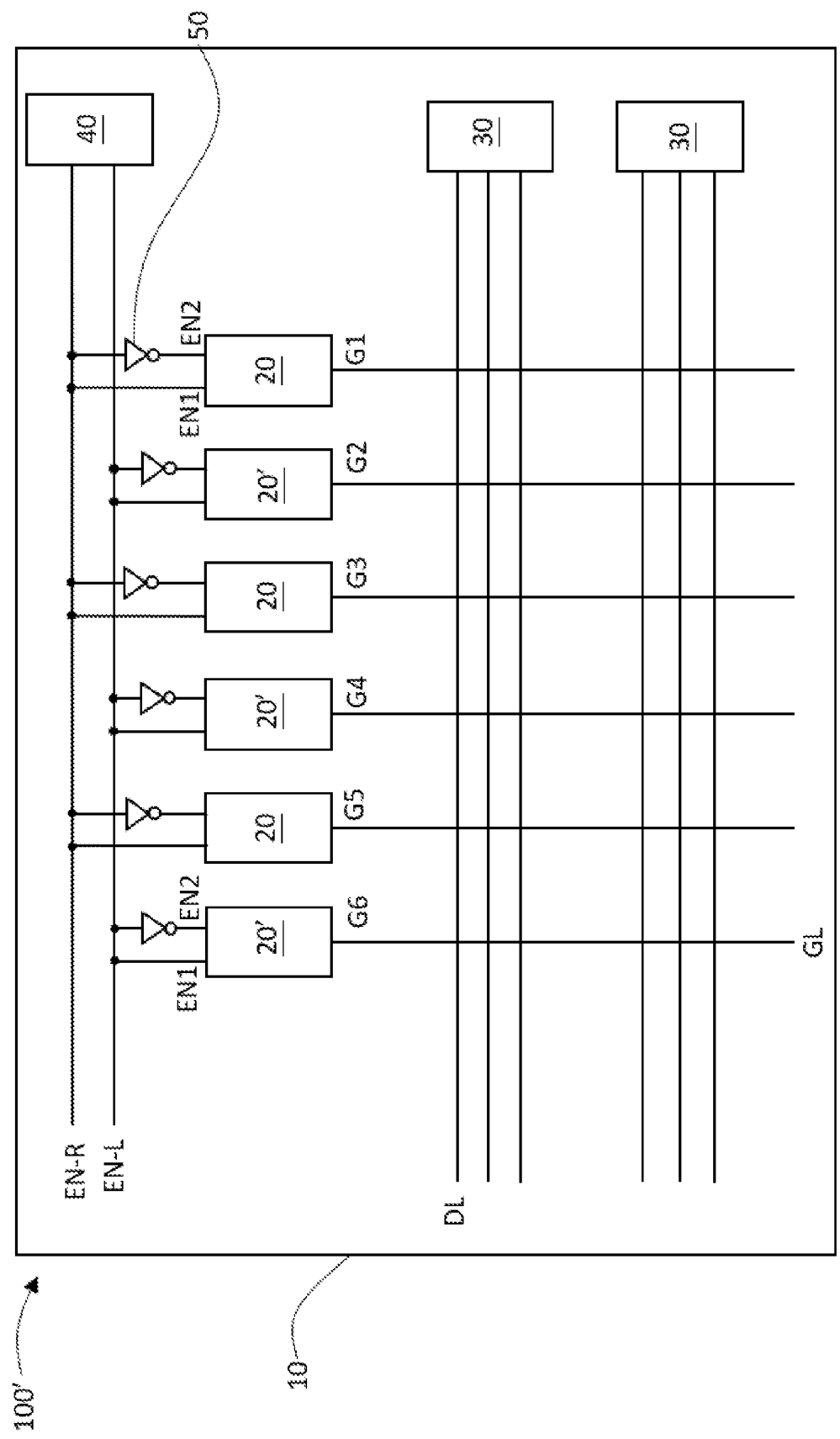
FIG. 3 is a schematic view of a display panel according to another embodiment of the present disclosure

Referring to FIG. 3, in one embodiment of the display panel 100', odd stages of the GOA units 20 are connected to the first enabling line EN-R, and even stages of the GOA units 20' are connected to the second enabling line EN-L. In detail, the selection circuit 40 control the odd stages of the GOA units 20 of the display panel 100' to display and the even stages of the GOA units 20' of the display panel 100' not to display or reversed through the first enabling line EN-R and the second enabling line EN-L. The display panel 100' is suitable for some 3D display with a prism plate to show left eye images and right eye images respectively. The display panel 100' is suitable for a scenario of power saving to provide the display panel 100' display with half numbers of pixels.

The above are only a few configurations of the selection circuit 40 and the GOA units 20, 20'. The present invention is not limited to this. The selection circuit 40 and the GOA units 20, 20' can also be configured according to actual needs, for example, every two GOA units are a group for startup and shutdown alternatingly, or every three GOA units are a group.

The GOA circuit and the display panel of the disclosure provides the selection module to output the scan signal optionally without affecting a stage transmitting function of the GOA units. It can control the output of the scan signal by electrical levels of the first control signal and the second control signal.

In the above-mentioned embodiments, the description of each embodiment has its own emphasis. For parts that are not described in detail in any embodiment, please refer to related descriptions of other embodiments.

The present disclosure has been described by the above embodiments, but the embodiments are merely examples for implementing the present disclosure. It must be noted that the embodiments do not limit the scope of the invention. In contrast, modifications and equivalent arrangements are intended to be included within the scope of the invention.

What is claimed is:

1. A gate driver on array (GOA) circuit, comprising a plurality of cascading GOA units, wherein a current stage of the GOA units comprises: a pull-up module, a pull-up control module, a pull-down module, a pull-down maintaining module, and a selection module, and wherein the pull-up module comprises:

a first transistor, wherein a source of the first transistor is connected to the selection module, a gate of the first transistor is connected to the pull-up control module through a first node, and a drain of the first transistor is configured to output a scan signal of the current stage; and an eleventh transistor, wherein a source of the eleventh transistor is configured to receive a clock signal, a gate of the eleventh transistor is connected to the first node, and a drain of the eleventh transistor is configured to output a starting signal of the current stage to a next stage of the GOA units, wherein the pull-up control module is configured to receive a starting signal of a previous stage of the GOA units and control the first transistor and the eleventh transistor to turn on or off by the first node; and wherein the selection module is configured to receive a first control signal and a second control signal to control the clock signal to transmit to the source of the first transistor and the gate driver on array circuit is configured to selectively output scan signals under the control of the selection module;

the selection module comprises a first control transistor and a second control transistor, a source of the first control transistor is configured to receive the clock signal, a gate of the first control transistor is configured to receive the first control signal, a drain of the first control transistor is connected to a source of the second control transistor, a gate of the second transistor is configured to receive the second control signal, a drain of the second control transistor is connected to a reference low level, the first transistor is configured to receive the clock signal through the first control transistor, and the first transistor is connected to the reference low level through the second control transistor.

2. The GOA circuit according to claim 1, wherein the pull-up control module comprises a starting transistor, a source and a gate of the starting transistor are configured to receive the starting signal of the previous stage of the GOA units, and a drain of the starting transistor is connected to the first node.

3. The GOA circuit according to claim 1, wherein a phase of the second control signal and a phase of the first control signal are totally in opposite phase.

4. The GOA circuit according to claim 1, wherein the pull-down module comprises:
   a second transistor, wherein a source of the second transistor is connected to the drain of the first transistor, a gate of the second transistor is configured to receive a starting signal of a next stage of the GOA units, and a drain of the second transistor is connected to a second low level; and
   a twelfth transistor, wherein a source of the twelfth transistor is connected to the first node, a gate of the twelfth transistor is configured to receive the starting signal of the next stage of the GOA units, and a drain of the twelfth transistor is connected to the first low level.

5. The GOA circuit according to claim 1, wherein the pull-down maintaining module comprises:
   a third transistor, wherein a gate of the third transistor is connected to a second node, a source of the third transistor is connected to the first node, and a drain of the third transistor is connected to the first low level;
   a fourth transistor, wherein a source of the fourth transistor is configured to receive the scan signal of the current stage, a gate of the fourth transistor is connected to the second node, and a drain of the fourth transistor is connected to the second low level;
   a fifth transistor, wherein a source of the fifth transistor is configured to receive the starting signal of the current stage, a gate of the fifth transistor is connected to the second node, and a drain of the fifth transistor is connected to the first low level;
   a sixth transistor, wherein a source and a gate of the sixth transistor are configured to receive a first switch signal;
   a seventh transistor, wherein a source of the seventh transistor is connected to a drain of the sixth transistor, a gate of the seventh transistor is connected to the first node, and a drain of the seventh transistor is connected to the first low level;
   an eighth transistor, wherein a source of the eighth transistor is configured to receive the first switch signal, a gate of the eighth transistor is connected to the drain of the sixth transistor; and
   a ninth transistor, wherein a source of the ninth transistor is connected to a drain of the eighth transistor, a gate of the ninth transistor is connected to the first node, and a drain of the ninth transistor is connected to the first low level.

6. The GOA circuit according to claim 5, wherein the pull-down maintaining module comprises:
   a thirteenth transistor, wherein a source of the thirteenth transistor is configured to receive the scan signal of the current stage, a gate of the thirteenth transistor is connected to a third node, and a drain of the thirteenth transistor is connected to the second low level;
   a fourteenth transistor, wherein a source of the fourteenth transistor is connected to the first node, a gate of the fourteenth transistor is connected to the third node, and a drain of the fourteenth transistor is connected to the first low level;
   a fifteenth transistor, wherein a source of the fifteenth transistor is configured to receive the starting signal of the current stage, a gate of the fifteenth transistor is connected to the third node, and a drain of the fifteenth transistor is connected to the first low level;
   a sixteenth transistor, wherein a source and a gate of the sixteenth transistor are configured to receive a second switch signal;
   a seventeenth transistor, wherein a source of the seventeenth transistor is connected to a drain of the sixteenth transistor, a gate of the seventeenth transistor is connected to the first node, and a drain of the seventeenth transistor is connected to the first low level;
   an eighteenth transistor, wherein a source of the eighteenth transistor is configured to receive the second switch signal, and a gate of the eighteenth transistor is connected to the drain of the sixteenth transistor; and
   a nineteenth transistor, wherein a source of the nineteenth transistor is connected to a drain of the eighteenth transistor, a gate of the nineteenth transistor is connected to the first node, and a drain of the nineteenth transistor is connected to the first low level.

7. A display panel, comprising a gate driver on array (GOA) circuit, an array substrate, and a selection circuit, wherein the GOA circuit comprises a plurality of cascading GOA units, wherein a current stage of the GOA units comprises: a pull-up module, a pull-up control module, a pull-down module, a pull-down maintaining module, and a selection module, and wherein the pull-up module comprises:
   a first transistor, wherein a source of the first transistor is connected to the selection module, a gate of the first transistor is connected to the pull-up control module through a first node, and a drain of the first transistor is configured to output a scan signal of the current stage; and
   an eleventh transistor, wherein a source of the eleventh transistor is configured to receive a clock signal, a gate of the eleventh transistor is connected to the first node, and a drain of the eleventh transistor is configured to output a starting signal of the current stage to a next stage of the GOA units,
   wherein the pull-up control module is configured to receive a starting signal of a previous stage of the GOA units and control the first transistor and the eleventh transistor to turn on or off by the first node;
   wherein the selection module is configured to receive a first control signal and a second control signal to control the clock signal to transmit to the source of the first transistor, and the gate driver on array circuit is configured to selectively output scan signals under the control of the selection module;
   wherein the selection circuit comprises a first enabling line and a second enabling line, and the first enabling line is configured to provide the first control signal to a portion of the GOA units; and
   wherein the second enabling line is configured to provide the first control signal to another portion of the GOA units;
   wherein the selection module comprises a first control transistor and a second control transistor, a source of the first control transistor is configured to receive the clock signal, a gate of the first control transistor is configured to receive the first control signal, a drain of the first control transistor is connected to a source of the second control transistor, a gate of the second transistor is configured to receive the second control signal, a drain of the second control transistor is connected to a reference low level, the first transistor is configured to receive the clock signal through the first control transistor, and the first transistor is connected to the reference low level through the second control transistor.

8. The display panel according to claim 7, wherein each of the GOA units comprises an inverter gate to reverse the first control signal to provide the second control signal correspondingly.

9. The display panel according to claim 7, wherein odd stages of the GOA units are connected to the first enabling line, and even stages of the GOA units are connected to the second enabling line.

10. The display panel according to claim 9, wherein the pull-up control module comprises a starting transistor, a source and a gate of the starting transistor are configured to receive the starting signal of the previous stage of the GOA units, and a drain of the starting transistor is connected to the first node.

11. The display panel according to claim 7, wherein a phase of the second control signal and a phase of the first control signal are totally in opposite phase.

12. The display panel according to claim 7, wherein the pull-down module comprises:
  a second transistor, wherein a source of the second transistor is connected to the drain of the first transistor, a gate of the second transistor is configured to receive a starting signal of a next stage of the GOA units, and a drain of the second transistor is connected to a second low level; and
  a twelfth transistor, wherein a source of the twelfth transistor is connected to the first node, a gate of the twelfth transistor is configured to receive the starting signal of the next stage of the GOA units, and a drain of the twelfth transistor is connected to the first low level.

13. The display panel according to claim 7, wherein the pull-down maintaining module comprises:
  a third transistor, wherein a gate of the third transistor is connected to a second node, a source of the third transistor is connected to the first node, and a drain of the third transistor is connected to the first low level;
  a fourth transistor, wherein a source of the fourth transistor is configured to receive the scan signal of the current stage, a gate of the fourth transistor is connected to the second node, and a drain of the fourth transistor is connected to the second low level;
  a fifth transistor, wherein a source of the fifth transistor is configured to receive the starting signal of the current stage, a gate of the fifth transistor is connected to the second node, and a drain of the fifth transistor is connected to the first low level;
  a sixth transistor, wherein a source and a gate of the sixth transistor are configured to receive a first switch signal;
  a seventh transistor, wherein a source of the seventh transistor is connected to a drain of the sixth transistor, a gate of the seventh transistor is connected to the first node, and a drain of the seventh transistor is connected to the first low level;
  an eighth transistor, wherein a source of the eighth transistor is configured to receive the first switch signal, a gate of the eighth transistor is connected to the drain of the sixth transistor; and
  a ninth transistor, wherein a source of the ninth transistor is connected to a drain of the eighth transistor, a gate of the ninth transistor is connected to the first node, and a drain of the ninth transistor is connected to the first low level.

14. The display panel according to claim 13, wherein the pull-down maintaining module comprises:
  a thirteenth transistor, wherein a source of the thirteenth transistor is configured to receive the scan signal of the current stage, a gate of the thirteenth transistor is connected to a third node, and a drain of the thirteenth transistor is connected to the second low level;
  a fourteenth transistor, wherein a source of the fourteenth transistor is connected to the first node, a gate of the fourteenth transistor is connected to the third node, and a drain of the fourteenth transistor is connected to the first low level;
  a fifteenth transistor, wherein a source of the fifteenth transistor is configured to receive the starting signal of the current stage, a gate of the fifteenth transistor is connected to the third node, and a drain of the fifteenth transistor is connected to the first low level;
  a sixteenth transistor, wherein a source and a gate of the sixteenth transistor are configured to receive a second switch signal;
  a seventeenth transistor, wherein a source of the seventeenth transistor is connected to a drain of the sixteenth transistor, a gate of the seventeenth transistor is connected to the first node, and a drain of the seventeenth transistor is connected to the first low level;
  an eighteenth transistor, wherein a source of the eighteenth transistor is configured to receive the second switch signal, and a gate of the eighteenth transistor is connected to the drain of the sixteenth transistor; and
  a nineteenth transistor, wherein a source of the nineteenth transistor is connected to a drain of the eighteenth transistor, a gate of the nineteenth transistor is connected to the first node, and a drain of the nineteenth transistor is connected to the first low level.

15. A display panel, comprising a gate driver on array (GOA) circuit, an array substrate, and a selection circuit, wherein the GOA circuit comprises a plurality of cascading GOA units, wherein a current stage of the GOA units comprises: a pull-up module, a pull-up control module, a pull-down module, a pull-down maintaining module, and a selection module, and wherein the pull-up module comprises:
  a first transistor, wherein a source of the first transistor is connected to the selection module, a gate of the first transistor is connected to the pull-up control module through a first node, and a drain of the first transistor is configured to output a scan signal of the current stage; and
  an eleventh transistor, wherein a source of the eleventh transistor is configured to receive a clock signal, a gate of the eleventh transistor is connected to the first node, and a drain of the eleventh transistor is configured to output a starting signal of the current stage to a next stage of the GOA units,
  wherein the pull-up control module comprises a starting transistor, a source and a gate of the starting transistor are configured to receive a starting signal of a previous stage of the GOA units, and a drain of the starting transistor is connected to the first node;
  wherein the pull-up control module is configured to receive the starting signal of the previous stage of the GOA units and control the first transistor and the eleventh transistor to turn on or off by the first node;
  wherein the selection module is configured to receive a first control signal and a second control signal to control the clock signal to transmit to the source of the first transistor, and the gate driver on array circuit is configured to selectively output scan signals under the control of the selection module;
  wherein the selection circuit comprises a first enabling line and a second enabling line, and the first enabling line is configured to provide the first control signal to a portion of the GOA units; and wherein the second enabling line is configured to provide the first control signal to another portion of the GOA units;

the selection module comprises a first control transistor and a second control transistor, a source of the first control transistor is configured to receive the clock signal, a gate of the first control transistor is configured to receive the first control signal, a drain of the first control transistor is connected to a source of the second control transistor, a gate of the second transistor is configured to receive the second control signal, a drain of the second control transistor is connected to a reference low level, the first transistor is configured to receive the clock signal through the first control transistor, and the first transistor is connected to the reference low level through the second control transistor.

* * * * *